(12) United States Patent
Han et al.

(10) Patent No.: US 7,358,197 B2
(45) Date of Patent: Apr. 15, 2008

(54) METHOD FOR AVOIDING POLYSILICON FILM OVER ETCH ABNORMAL

(75) Inventors: Bruce Han, Taipei (TW); Jen-Tsung Lin, Taichung (TW); Kuo-Ping Huang, Miao-Li (TW)

(73) Assignee: United Microelectronics Corp., Hsin-Chu (TW)

( * ) Notice: Subject to any disclaimer, the term of this patent is extended or adjusted under 35 U.S.C. 154(b) by 90 days.

(21) Appl. No.: 10/690,665

(22) Filed: Oct. 23, 2003

(65) Prior Publication Data

US 2005/0087510 A1    Apr. 28, 2005

(51) Int. Cl.
*H01L 21/302* (2006.01)
(52) U.S. Cl. .................. 438/763; 438/680; 438/714; 134/1.3
(58) Field of Classification Search ............... 134/1.3; 438/714, 763, 680
See application file for complete search history.

(56) References Cited

U.S. PATENT DOCUMENTS

| | | | | |
|---|---|---|---|---|
| 5,237,196 A | * | 8/1993 | Mikata et al. | 257/409 |
| 5,441,904 A | * | 8/1995 | Kim et al. | 438/592 |
| 5,723,356 A | * | 3/1998 | Tsukamoto | 438/199 |
| 5,763,303 A | * | 6/1998 | Liaw et al. | 438/210 |
| 2004/0213907 A1 | * | 10/2004 | Todd et al. | 427/255.18 |

FOREIGN PATENT DOCUMENTS

| JP | 54-065474 | * | 5/1979 |
|---|---|---|---|
| JP | 2001-210593 | * | 8/2001 |

* cited by examiner

*Primary Examiner*—George A Goudreau
(74) *Attorney, Agent, or Firm*—Nixon & Vanderhye P.C.

(57) ABSTRACT

The method for avoiding polysilicon film over etch abnormal includes cleaning a semiconductor substrate. A dielectric layer is formed on the substrate. Subsequently, a first silicon source gas at a first flow rate is next performed injecting into a reaction chamber to form a first polysilicon film over the dielectric layer. Successively, a second silicon source gas at a second flow rate is performed injecting into the reaction chamber to form a second polysilicon film over the first polysilicon film, wherein the second silicon source gas having a different growth rate than the first silicon source gas. A patterned photoresist layer is then formed on the second polysilicon film. After the patterned photoresist layer is formed, a dry etching process by way of using the patterned photoresist layer as a etching mask is performed to etch through in turn the second polysilicon film and the first polysilicon film till exposing to the dielectric layer. Finally, the photoresist layer is removed.

38 Claims, 4 Drawing Sheets

METHOD FOR AVOIDING POLYSILICON FILM OVER ETCH ABNORMAL

BACKGROUND OF THE INVENTION

1. Field of the Invention

The present invention relates to an etch of polysilicon film, and more specifically, to a method for avoiding over etch abnormal of the polysilicon film.

2. Description of the Prior Art

The gate performance of semiconductor process is effected greatly by the grain structure of polysilicon film. The grain structure change due to a different process condition will induce electricity abnormal of devices and reduce the products yield. In depositing column structure polysilicon film or random structure polysilicon film, the depositing film surface has a different growth rate due to grain orientation to cause grain structure surface forming a deeply void. The void will lead to polysilicon film over etch abnormal in the proceeding etch process, therefore, affect the electricity of the devices enormously, thereby scraping the products.

Above mentioned, the gate performance of semiconductor process is effected greatly by the grain structure of polysilicon film. The forming structure of the polysilicon film includes column structure and random structure. Generally speaking, the random structure has more superior protection ability than column structure in Boron penetration. Therefore, in the advanced process, the random structure polysilicon film is selected to keep more stable electricity.

In depositing the polysilicon film step, the polysilicon film form a rough and uneven surface due to the different orientation grain growth rate. The height difference of the polysilicon film surface thickness reaches above 10% total thickness of the polysilicon film. Moreover, in the proceeding etch process of the polysilicon film is used by over etch method to remove the expected removal polysilicon film area completely to expose a silicon oxide layer, thereby the silicon oxide layer at the top of the substrate can protect the substrate under the silicon oxide layer.

FIG. 1 to FIG. 4 are process of forming void in substrate in the step of etching polysilicon film according to the prior art. The substrate will produce void due to the forming rough and uneven surface polysilicon film in the proceeding etch process of the polysilicon film. Referring to FIG. 1, the patterned photoresist 16 is formed on the polysilicon layer 14, wherein the polysilicon layer 14 is formed on silicon oxide layer 12 at the top of the substrate 10. Subsequently, an uncovered polysilicon layer 14 is removed gradually in the etching step to form a polysilicon layer 18. In the etching step, the silicon oxide layer 12 at the top of the substrate 10 can protect the substrate 10 from etching, illustrated diagrammatically in FIG. 2. Next, due to the rough and uneven surface polysilicon layer 14 and too thin silicon oxide layer 12, the silicon oxide layer 12 will be etched to form a polysilicon layer 22 and a local void 20, illustrated diagrammatically in FIG. 3. Successively, in the remaining polysilicon layer 22 proceeding etching, because the substrate 10 has the same silicon material with the remaining polysilicon layer 22, the substrate 10 will be etched quickly to form a local void 24, illustrated diagrammatically in FIG. 4.

For the sub-micron semiconductor devices, if the height difference of the polysilicon film surface thickness is too large, the silicon oxide layer under the thickness thinner polysilicon film will be etched abnormally to form a void, as mentioned above. Moreover, reduction the over etch extent may be made the polysilicon film removed incompletely, thereby the process window can not be controlled by the over etch method.

Therefore, in view of the prior art drawback, considering more thinner silicon oxide thickness and polysilicon film over etch margin, a method of avoiding the polysilicon film surface void must be developed to avoid silicon oxide layer etched abnormally to form a void.

SUMMARY OF THE INVENTION

In view of the prior art drawback, the object of the present invention is to disclose a method of forming polysilicon film.

The further object of the present invention is to disclose a method for avoid polysilicon film over etch abnormal.

The method for avoiding polysilicon film over etch abnormal includes cleaning a semiconductor substrate. A dielectric layer is formed on the substrate. Subsequently, a first silicon source gas at a first flow rate is next performed injecting into a reaction chamber to form a first polysilicon film over the dielectric layer. Successively, a second silicon source gas at a second flow rate is performed injecting into the reaction chamber to form a second polysilicon film over the first polysilicon film, wherein the second silicon source gas having a different growth rate than the first silicon source gas. A patterned photoresist layer is then formed on the second polysilicon film. After the patterned photoresist layer is formed, a dry etching process by way of using the patterned photoresist layer as a etching mask is performed to etch through in turn the second polysilicon film and the first polysilicon film till exposing to the dielectric layer. Finally, the photoresist layer is removed.

The method for forming a polysilicon film on a gate dielectric layer includes cleaning a semiconductor substrate. A dielectric layer is formed on the substrate. Subsequently, a first silicon source gas at a first flow rate is next performed injecting into a reaction chamber to form a first polysilicon film over the dielectric layer. Finally, a second silicon source gas at a second flow rate is performed injecting into the reaction chamber to form a second polysilicon film over the first polysilicon film, wherein the second silicon source gas having a different growth rate than the first silicon source gas.

BRIEF DESCRIPTION OF THE DRAWINGS

The foregoing aspects and many of the attendant advantages of this invention will become more readily appreciated as the same becomes better understood by reference to the following detailed descriptions, when taken in conjunction with the accompanying drawings, wherein.

DESCRIPTION OF THE PREFERRED EMBODIMENT

The present invention discloses a novel method to form the polysilicon film. The aspect of the present invention includes a method for avoid polysilicon film over etch abnormal. The detail description of the method will be seen as follows.

Figure 1:
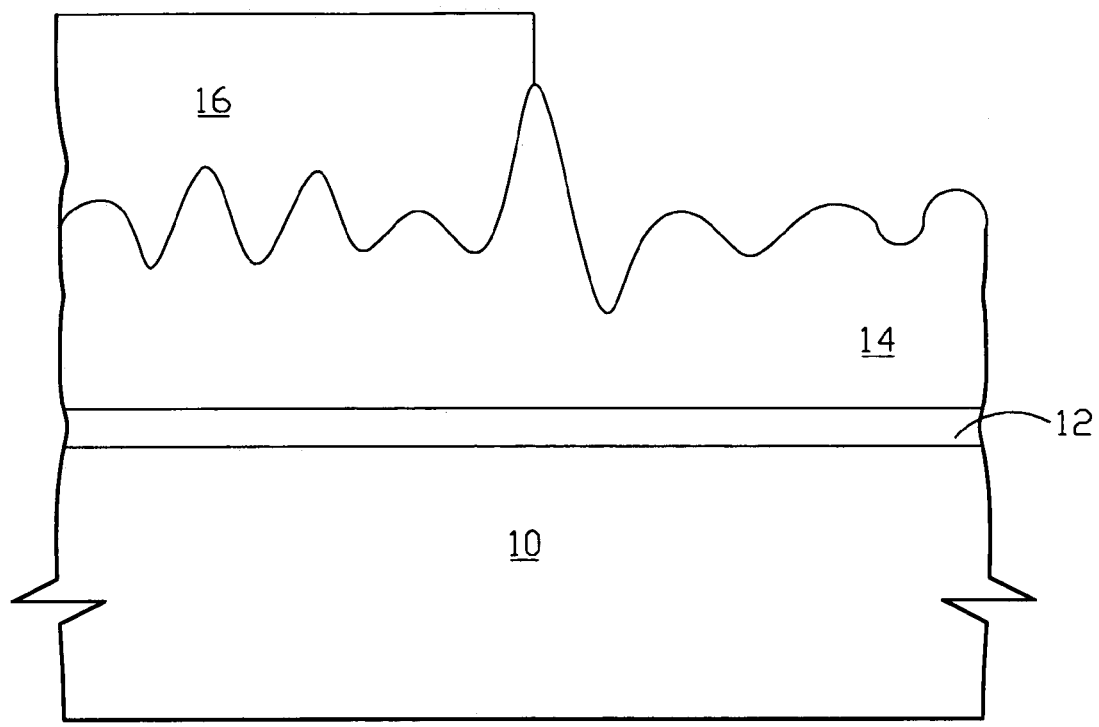
FIG. 1 is the cross sectional view of a substrate illustrating the step of forming patterned photoresist layer according to the prior art.
Figure 2:
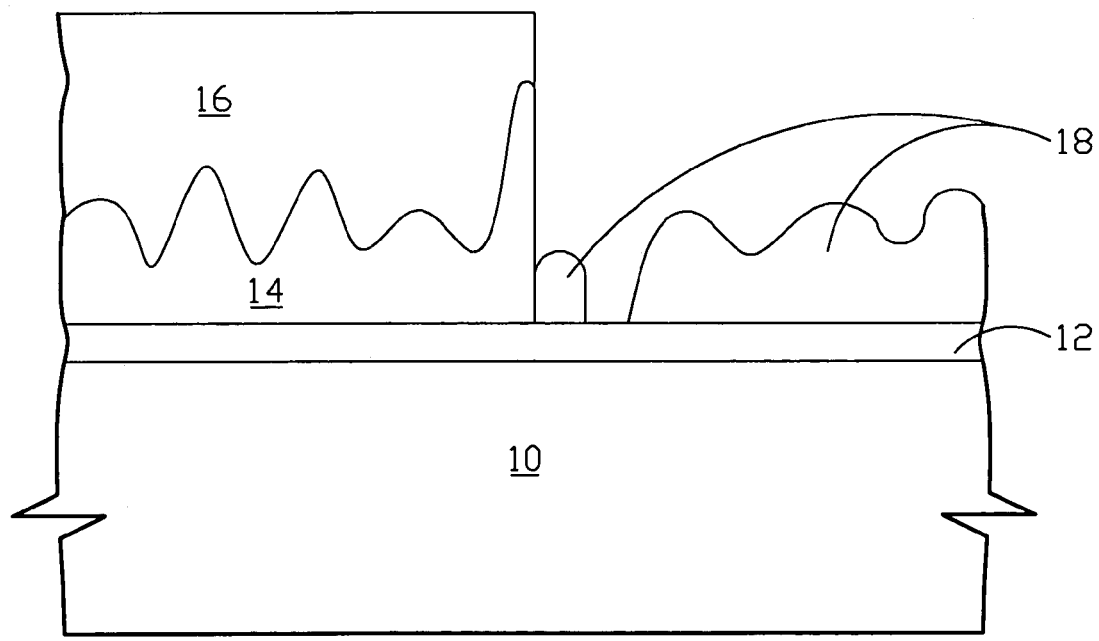
FIG. 2 is the cross sectional view of a substrate illustrating the step of etching the polysilicon film according to the prior art.
Figure 3:
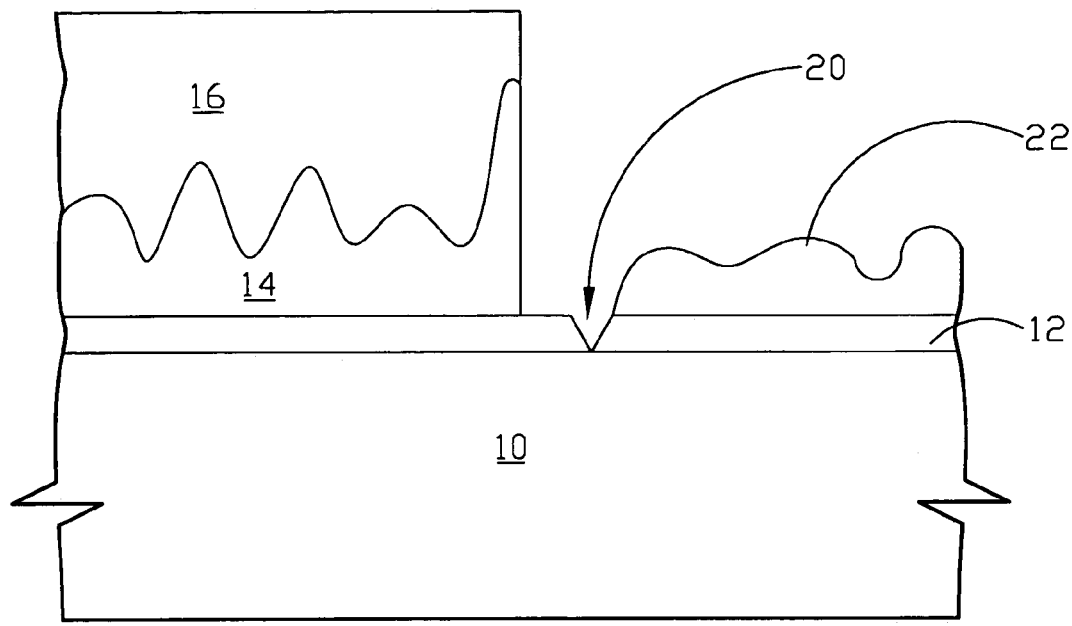
FIG. 3 is the cross sectional view of a substrate illustrating the step of forming void in silicon dioxide layer in etching the polysilicon film step according to the prior art.
Figure 4:
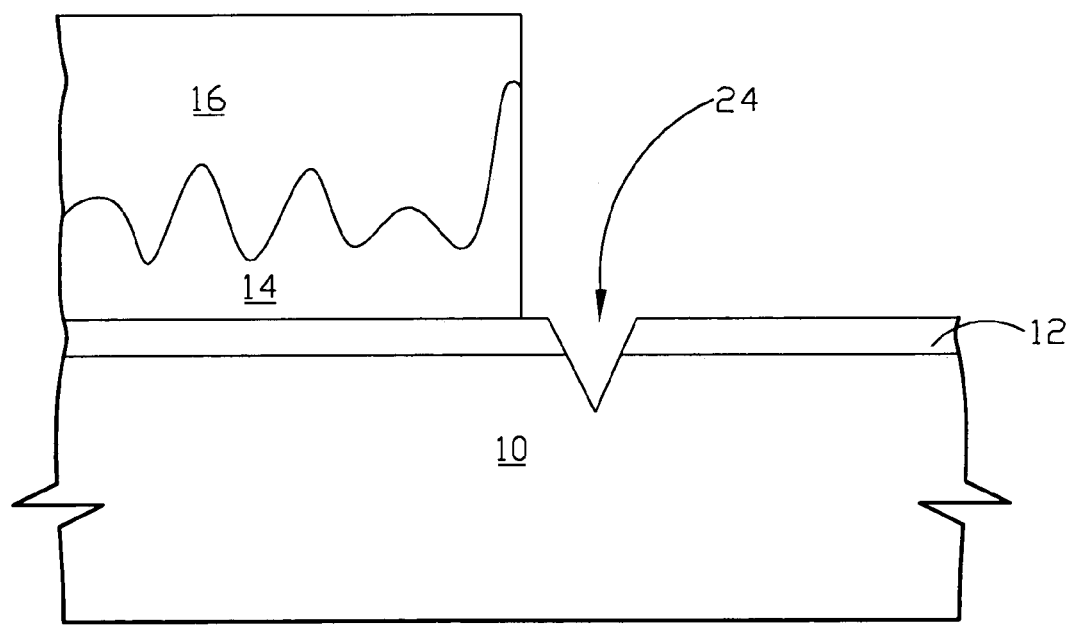
FIG. 4 is the cross sectional view of a substrate illustrating the step of forming void in substrate in etching the polysilicon film step according to the prior art.
Figure 5:
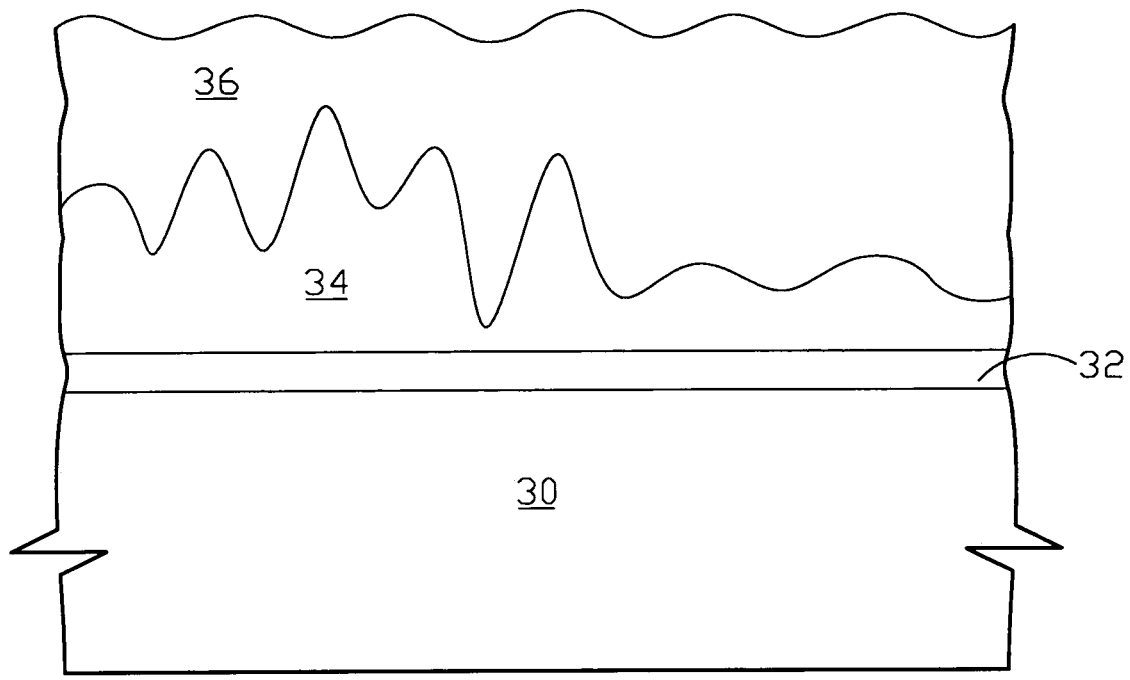
FIG. 5 is the cross sectional view of a substrate illustrating the step of forming the polysilicon layer according to the present invention.

Turning to FIG. 5, it shows the cross sectional view of forming a polysilicon layer on a silicon dioxide according to the present invention. The first procedure of the present invention is to clean a semiconductor substrate 30. The cleaning step, for example, is performed by a dilute Hydro-Fluorine (HF) solution to remove native oxide and impurity forming on the surface of the semiconductor substrate 30. The semiconductor substrate 30 according to the present invention suitably includes a single crystal wafer 30 with a <100> or <111> crystallographic orientation. Other substrate material may be used. Next, a dielectric layer 32 is formed on the substrate 30. In a preferred embodiment, the dielectric layer 32 is a gate dielectric layer, for example, silicon dioxide layer 32 suitably formed in the RTO (Rapid Thermal Oxidation) OXIDE chamber. However, the suitably temperature and pressure for forming the silicon dioxide layer 32 may be between about 500 centigrade degrees to 700 centigrade degrees and between about 150 mTorr to 1.5 Torr, respectively. In a preferred embodiment, the silicon dioxide layer 32 thickness is 21 angstroms.

Further, the silicon dioxide layer 32 also acts as a cushion between the silicon substrate 30 and a subsequent polysilicon layer for reducing stress during subsequent polysilicon layer forming.

Subsequently, after the silicon dioxide layer 32 is formed, an un-doped polysilicon layer is formed on the silicon dioxide 32. In a preferred embodiment, the polysilicon layer thickness for 0.13 um design rule is about 1750 angstroms. The polysilicon layer is formed by a group of silane base gas. The silane base gas is selected from the group consisting of $SiH_4$ (silane), $Si_2H_6$ (disilane), $Si_3H_8$ (trisilane or $SiH_2Cl_2$ (dichlorosilane). In a preferred embodiment, the forming of the polysilicon layer is used a $SiH_4$ (silane) as a reaction gas to deposit firstly, thereby forming a thickness about 1400 angstroms of a polysilicon layer 34. The measurement result of Atomic Force Microscope (AFM) shows that the surface of the polysilicon layer 34 is a rough and uneven surface (RMS=2.5 nm) with a deep void. The result of the rough and uneven surface with a deep void is also the same result of forming a thickness about 1750 angstroms of the polysilicon layer using a single $SiH_4$ (silane) or $Si_2H_6$ (disilane) gas Furthermore, a thickness about 1750 angstroms of the polysilicon layer is more rough and uneven surface than a thickness about 1400 angstroms of the polysilicon layer. The polysilicon film 34 is formed on the silicon dioxide 32 by injecting the $SiH_4$ (silane) gas at a flow rate into a the RTO (Rapid Thermal Oxidation) POLY reaction chamber.

Successively, after the thickness about 1400 angstroms of polysilicon film 34 is formed, a polysilicon film 36 is formed on the polysilicon film 34 by injecting the $Si_2H_6$ (disilane) gas at a flow rate into a the RTO (Rapid Thermal Oxidation) POLY reaction chamber, thereby forming a total thickness about 1750 angstroms of polysilicon film. The measurement result of Atomic Force Microscope (AFM) shows that the surface of the thickness about 1750 angstroms of two silane base gas polysilicon layer is a flatness surface (RMS=1.079 nm) without a void. The flatness surface polysilicon layer can not reach by using a single $SiH_4$ (silane) or $Si_2H_6$ (disilane) gas.

In the sub-micron generation, the method of forming gate of the semiconductor devices is generally to select and adopt the RTO (Rapid Thermal Oxidation) method. Under the consideration of line-width shrink and thermal budget of the devices, the smaller grains of the polysilicon film have better effect than column structure grains formed in a furnace to avoid the Boron penetration. Therefore, the RTO (Rapid Thermal Oxidation) method will become as a dominant method of forming the gate polysilicon film in nano-meter generation.

Figure 6:
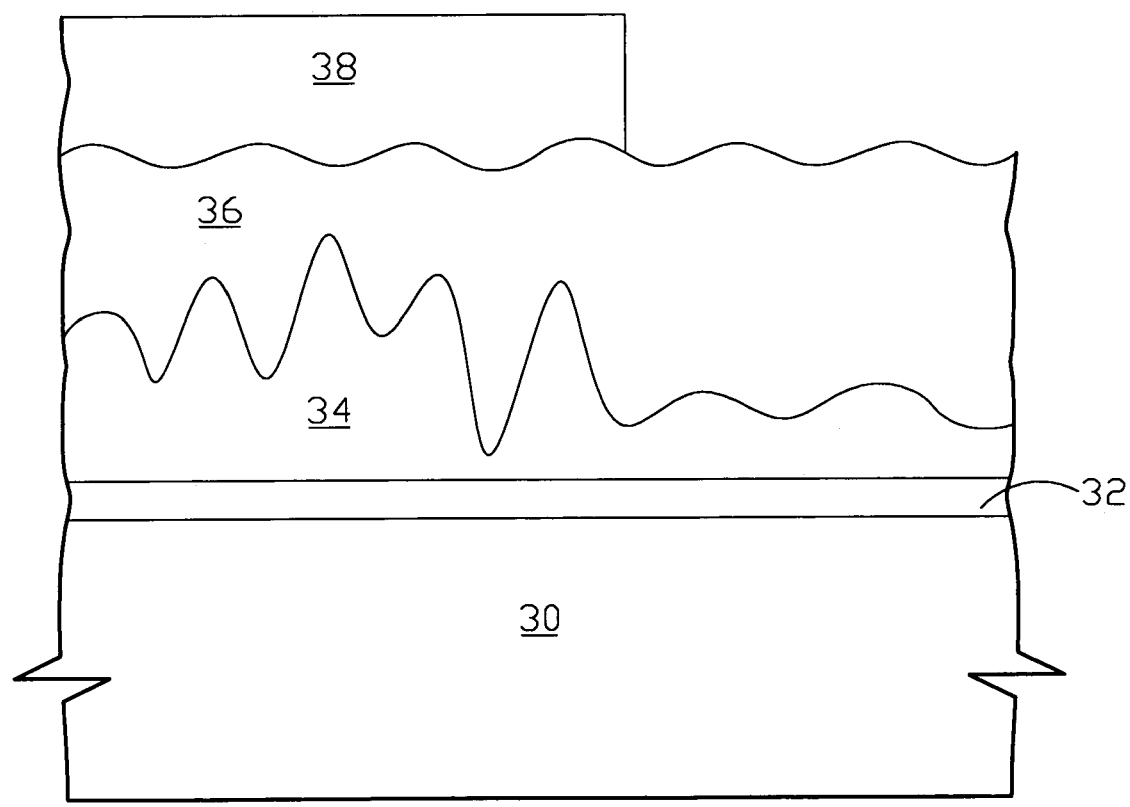
FIG. 6 is the cross sectional view of a substrate illustrating the step of forming patterned photoresist layer according to the present invention.
Figure 7:
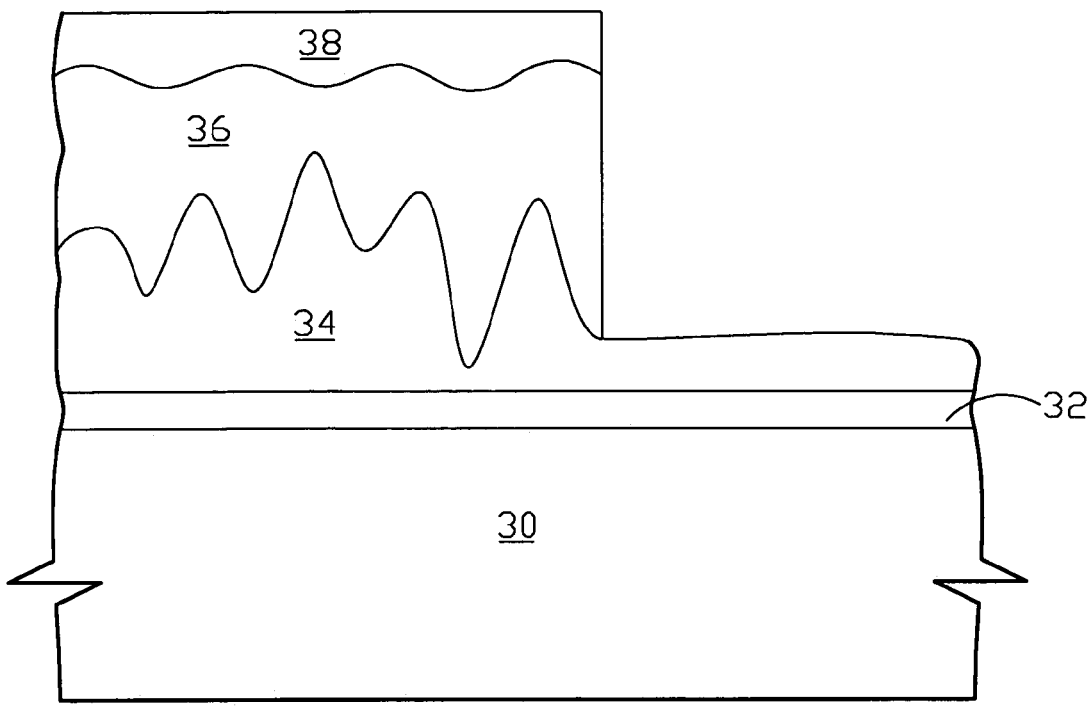
FIG. 7 is the cross sectional view of a substrate illustrating the step of etching the polysilicon film according to the present invention.
Figure 8:
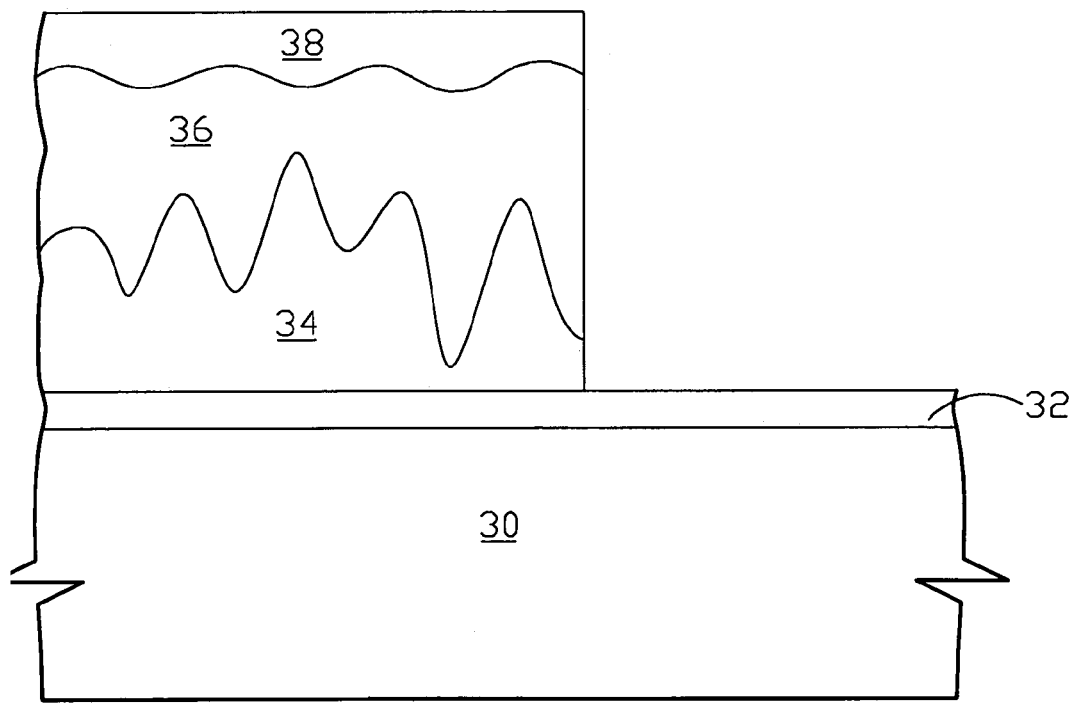
FIG. 8 is the cross sectional view of a substrate illustrating the step of etching the polysilicon film according to the present invention.

Turning to FIG. 6, it is the cross sectional view of a substrate illustrating the step of forming patterned photoresist layer according to the present invention. A patterned photoresist layer is formed on the polysilicon layer 36 by using conventional lithography procedure. Next, a dry etching process by way of using the patterned photoresist layer 38 as a etching mask is performed to anisotropically etch through in turn the polysilicon layer 36 and the polysilicon layer 34. The polysilicon layer 36 has a flatness surface and the etching selectivity of the polysilicon layer 36 and the polysilicon layer 34 are similar, therefore after the polysilicon layer 36 is etched completely, the polysilicon layer 34 can be proceeded etching uniformly, illustrated diagrammatically in FIG. 7. Successively, the polysilicon layer 34 is proceeded etching completely to expose the silicon dioxide 32, illustrated diagrammatically in FIG. 8. Finally, the photoresist layer 38 is then removed.

As the above embodiment described, the present invention provides a method for avoiding a polysilicon film over etch abnormal. The polysilicon layer of forming by two silane base gas is a flatness surface, thereby the polysilicon layer could not create a void after the etching process. A single silane base gas $SiH_4$ (silane) or $Si_2H_6$ (disilane) gas is a rough and uneven surface, thereby the polysilicon layer could create a various deep void after the etching process.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method for forming a polysilicon film on a dielectric layer, said method comprising:
providing a semiconductor substrate having a dielectric layer thereon in a reaction chamber;

injecting a first silicon source gas at a first flow rate into said reaction chamber to form a first polysilicon film with a first surface over said dielectric layer;

injecting a second silicon source gas at a second flow rate into said reaction chamber to form a second polysilicon film with a second surface having a higher flatness compared to said first surface over said first polysilicon film, wherein said second silicon source gas has a different growth rate than said first silicon source gas;

patterning said second polysilicon film and said first polysilicon film by removing a region of said second polysilicon film and a part of said first polysilicon layer located thereunder so that a remaining part of the first polysilicon film forms a third surface flatter than said first surface; and removing said remaining part of the first polysilicon film until said dielectric layer is exposed.

2. A method as in claim 1, further comprising:
cleaning said semiconductor substrate before said dielectric layer is formed thereon.

3. A method as in claim 2, wherein said cleaning is performed by a dilute hydrofluoric acid to remove native oxide and impurity of said semiconductor substrate surface.

4. A method as in claim 2, wherein said dielectric layer is a gate dielectric layer.

5. A method as in claim 4, wherein said gate dielectric layer is silicon dioxide.

6. A method as in claim 5, wherein said silicon dioxide is formed in the RTO (Rapid Thermal Oxidation) oxide chamber.

7. A method as in claim 6, wherein said silicon dioxide is formed in a temperature range of from 500° C. to 700° C. and a pressure in a range of from 150 mTorr to 1.5 Torr.

8. A method as in claim 7, wherein said silicon dioxide has a thickness of about 15 angstrom to 30 angstrom.

9. A method as in claim 1, wherein said first silicon source gas is selected from the group consisting of silane ($SiH_4$), disilane ($Si_2H_6$), trisilane ($Si_3H_8$) and dichlorosilane ($SiH_2Cl_2$).

10. A method as in claim 9, wherein said first polysilicon film is formed in a RTO (Rapid Thermal Oxidation) poly chamber.

11. A method as in claim 1, wherein said injecting a first silicon source gas step is performed for a time period sufficient to form said first polysilicon film with a thickness of about 1000 angstrom to 2000 angstrom.

12. A method as in claim 1, wherein said second silicon source gases is selected from the group consisting of silane ($SiH_4$), disilane ($Si_2H_6$), trisilane ($Si_3H_8$) and dichlorosilane ($SiH_2Cl_2$).

13. A method as in claim 12, wherein said second polysilicon film is formed in a RTO (Rapid Thermal Oxidation) poly chamber.

14. A method as in claim 1, wherein said injecting a second silicon source gas step is performed for a time period sufficient to form said second polysilicon film with a thickness of about 200 angstrom to 1000 angstrom.

15. A method as in claim 1, wherein a total thickness of said first polysilicon film plus said second polysilicon film is about 1000 angstrom to 2500 angstrom.

16. A method as in claim 1, further comprising:
injecting a third silicon source gas into said reaction chamber to form a third polysilicon film over said second polysilicon film, said third silicon source gas having a different growth rate than said first and second silicon source gases; and patterning said third polysilicon film before patterning said first and second polysilicon films by removing a first region of said third polysilicon film, wherein said first region of the third polysilicon film corresponds to said region of the second polysilicon film.

17. A method as in claim 16, wherein said third silicon source gas is selected from the group consisting of silane ($SiH_4$), disilane ($Si_2H_6$), trisilane ($Si_3H_8$) and dichlorosilane ($SiH_2Cl_2$).

18. A method as in claim 17, wherein said first polysilicon film is formed in the RTO (Rapid Thermal Oxidation) poly chamber.

19. A method as in claim 16, wherein said injecting a third silicon source gas step is performed for a time period sufficient to form said third polysilicon film with a thickness of about 200 angstrom to 1000 angstrom.

20. A method as in claim 19, wherein a total thickness of said first polysilicon film, said second polysilicon film and said third polysilicon film is about 1500 angstrom to 3000 angstrom.

21. A method for avoiding polysilicon film being over-etched, said method comprising:
forming a dielectric layer on a semiconductor substrate;
forming a first polysilicon film over a dielectric layer, wherein said first polysilicon film is formed by a first silicon source gas at a first flow rate and has a first surface;
forming a second polysilicon film over said first polysilicon film, wherein said second polysilicon film is formed by a second silicon source gas at a second flow rate and has a second surface with a higher flatness compared to said first surface, said second silicon source gas having a different growth rate than said first silicon source gas;
forming a patterned photoresist layer on said second polysilicon film;
performing a dry etching process by using said patterned photoresist layer as an etching mask to etch said second polysilicon film and said first polysilicon film until said second polysilicon film is removed and a third surface of said first polysilicon film is formed;
removing said photoresist film under said third surface until said dielectric layer is exposed; and
removing said photoresist layer.

22. A method as in claim 21, further comprising:
cleaning said semiconductor substrate before forming said dielectric layer.

23. A method as in claim 22, wherein said cleaning is performed by a dilute hydrofluoric acid to remove native oxide and impurity of said semiconductor substrate surface.

24. A method as in claim 21, wherein said dielectric layer is a gate dielectric layer.

25. A method as in claim 24, wherein said gate dielectric layer is silicon dioxide.

26. A method as in claim 25, wherein said silicon dioxide is formed in a RTO (Rapid Thermal Oxidation) oxide chamber.

27. A method as in claim 26, wherein said silicon dioxide is formed in a temperature range of from 500° C. to 700° C. and a pressure range of from 150 mTorr to 1.5 Torr.

28. A method as in claim 27, wherein said silicon dioxide has a thickness of about 15 angstrom to 30 angstrom.

29. A method as in claim 21, wherein said first silicon source gas is selected from the group consisting of silane ($SiH_4$), disilane ($Si_2H_6$), trisilane ($Si_3H_8$) and dichlorosilane ($SiH_2Cl_2$).

30. A method as in claim 29, wherein said first polysilicon film is formed in a RTO (Rapid Thermal Oxidation) poly chamber.

31. A method as in claim 21, wherein said first polysilicon film has a thickness of about 1000 angstrom to 2000 angstrom.

32. A method as in claim 21, wherein said second silicon source gases is selected from the group consisting of silane ($SiH_4$), disilane ($Si_2H_6$), trisilane ($Si_3H_8$) and dichlorosilane ($SiH_2Cl_2$).

33. A method as in claim 32, wherein said second polysilicon film is formed in a RTO (Rapid Thermal Oxidation) poly chamber.

34. A method as in claim 21, wherein said second polysilicon film has a thickness of about 200 angstrom to 1000 angstrom.

35. A method as in claim 21, wherein total thickness of said first polysilicon film with said second polysilicon film is about 1000 angstrom to 2500 angstrom.

36. A method as in claim 21, further comprising:
forming a plurality of polysilicon films over said second polysilicon film before forming said patterned photoresist, wherein each of said polysilicon films is formed by a specific silicon source gas with a different growth rate than said first and second silicon source gases; and
wherein said dry etching process comprises removing said plurality of polysilicon films by using said patterned photoresist layer as an etching mask before removing said second polysilicon film.

37. A method as in claim 36, wherein said specific silicon source gas is selected from the group consisting of silane ($SiH_4$), disilane ($Si_2H_6$), trisilane ($Si_3H_8$) and dichlorosilane ($SiH_2Cl_2$).

38. A method as in claim 37, wherein each of said polysilicon films is formed in the RTO (Rapid Thermal Oxidation) poly chamber.

* * * * *